(12) United States Patent
Gose et al.

(10) Patent No.: US 12,341,454 B2
(45) Date of Patent: Jun. 24, 2025

(54) SYSTEMS AND METHODS FOR MULTIPLE OUTPUT INTEGRATED GATE DRIVER FOR INVERTER FOR ELECTRIC VEHICLE

(71) Applicant: BorgWarner US Technologies LLC, Wilmington, DE (US)

(72) Inventors: Mark Wendell Gose, Kokomo, IN (US); Seyed R. Zarabadi, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 254 days.

(21) Appl. No.: 18/168,106

(22) Filed: Feb. 13, 2023

(65) Prior Publication Data

US 2024/0106350 A1 Mar. 28, 2024

Related U.S. Application Data

(60) Provisional application No. 63/378,601, filed on Oct. 6, 2022, provisional application No. 63/377,512, filed
(Continued)

(51) Int. Cl.
*H02P 27/06* (2006.01)
*B60L 3/00* (2019.01)
(Continued)

(52) U.S. Cl.
CPC .............. *H02P 27/06* (2013.01); *B60L 3/003* (2013.01); *B60L 15/007* (2013.01); *B60L 15/08* (2013.01);
(Continued)

(58) Field of Classification Search
CPC .......... H02P 27/04; H02P 27/06; H02P 27/08; H02P 29/68; H02P 29/40; H02P 25/00;
(Continued)

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

WO 2004006037 A2 1/2004
WO 2007093598 A1 8/2007
(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.
(Continued)

*Primary Examiner* — Antony M Paul
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a power module including: a drain tab; a source tab; a first power switch including a first gate terminal configured to control a first flow of current between the drain tab and the source tab; a second power switch including a second gate terminal configured to control a second flow of current between the drain tab and the source tab; and one or more controllers configured to provide a first signal to the first gate terminal and a second signal to the second gate terminal.

17 Claims, 10 Drawing Sheets

Related U.S. Application Data on Sep. 28, 2022, provisional application No. 63/377,486, filed on Sep. 28, 2022, provisional application No. 63/377,501, filed on Sep. 28, 2022.

(51) Int. Cl.
| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2007.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC ...... H02P 25/03; H02P 25/062; H02P 25/064; H02P 29/0241; H02P 29/024; H02P 29/032; H02P 6/08; H02P 1/46; H02P 1/42; H02P 21/00; H02P 21/22; H02P 21/20; H02P 29/60; H02P 9/30; H02P 23/00; H02P 27/14; H02P 31/00; H02P 25/022; H02P 7/28; H02P 8/18; H02M 7/5387; H02M 1/0054; H02M 7/5395; H02M 3/33523; H02M 7/217; H02M 1/0048; H02M 7/162; H02M 3/33584; H02M 1/4233; H02M 3/33546; H02M 5/293; H02M 3/3376; H02M 5/45; H02M 3/33507; H02M 5/225; H02M 7/42; H02M 7/53871; H02M 7/797; H02M 1/123; H02M 1/327; H02M 1/0009; H02M 7/537; H02M 1/088; H02M 7/219; H02M 3/155; H02M 7/521; B62D 5/046

See application file for complete search history.

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |

(56) References Cited

U.S. PATENT DOCUMENTS

| | | | |
|---|---|---|---|
| 5,654,863 A | 8/1997 | Davies | |
| 5,764,007 A | 6/1998 | Jones | |
| 5,841,312 A | 11/1998 | Mindl et al. | |
| 6,028,470 A | 2/2000 | Michel et al. | |
| 6,163,138 A | 12/2000 | Kohl et al. | |
| 6,351,173 B1 | 2/2002 | Ovens et al. | |
| 6,426,857 B1 | 7/2002 | Doster et al. | |
| 6,597,556 B1 | 7/2003 | Michel et al. | |
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,229,855 B2 | 6/2007 | Murphy | |
| 7,295,433 B2 | 11/2007 | Taylor et al. | |
| 7,459,954 B2 | 12/2008 | Kuehner et al. | |
| 7,538,425 B2 | 5/2009 | Myers et al. | |
| 7,551,439 B2 | 6/2009 | Peugh et al. | |
| 7,616,047 B2 | 11/2009 | Rees et al. | |
| 7,724,046 B2 | 5/2010 | Wendt et al. | |
| 7,750,720 B2 | 7/2010 | Dittrich | |
| 9,088,159 B2 | 7/2015 | Peuser | |
| 9,275,915 B2 | 3/2016 | Heinisch et al. | |
| 9,373,970 B2 | 6/2016 | Feuerstack et al. | |
| 9,431,932 B2 | 8/2016 | Schmidt et al. | |
| 9,515,584 B2 | 12/2016 | Koller et al. | |
| 9,548,675 B2 | 1/2017 | Schoenknecht | |
| 9,806,607 B2 | 10/2017 | Ranmuthu et al. | |
| 9,843,320 B2 | 12/2017 | Richter et al. | |
| 9,871,444 B2 | 1/2018 | Ni et al. | |
| 9,882,490 B2 | 1/2018 | Veeramreddi et al. | |
| 10,111,285 B2 | 10/2018 | Shi et al. | |
| 10,116,300 B2 | 10/2018 | Blasco et al. | |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | S et al. | |
| 2009/0001410 A1* | 1/2009 | Shigeta | H02M 3/1588 257/E29.325 |
| 2013/0335134 A1* | 12/2013 | Kanazawa | H03K 3/012 257/77 |
| 2016/0352331 A1 | 12/2016 | Wang et al. | |
| 2017/0331469 A1 | 11/2017 | Kilb et al. | |
| 2020/0195121 A1 | 6/2020 | Keskar et al. | |
| 2021/0005711 A1 | 1/2021 | Martinez-Limia et al. | |
| 2021/0036699 A1* | 2/2021 | Lee | H03K 17/0812 |
| 2022/0018720 A1* | 1/2022 | Tulane | G01K 7/22 |
| 2022/0052610 A1 | 2/2022 | Plum | |
| 2022/0294441 A1 | 9/2022 | Purcarea et al. | |
| 2023/0010616 A1 | 1/2023 | Gschwantner et al. | |
| 2023/0061922 A1 | 3/2023 | Ritter | |
| 2023/0082076 A1 | 3/2023 | Strache et al. | |
| 2023/0126070 A1 | 4/2023 | Oberdieck et al. | |
| 2023/0179198 A1 | 6/2023 | Winkler | |
| 2023/0231210 A1 | 7/2023 | Joos et al. | |
| 2023/0231400 A1 | 7/2023 | Oberdieck et al. | |
| 2023/0231496 A1 | 7/2023 | Syed et al. | |
| 2023/0238808 A1 | 7/2023 | Swoboda et al. | |
| 2023/0268826 A1 | 8/2023 | Yan et al. | |
| 2023/0335509 A1 | 10/2023 | Poddar | |
| 2023/0365086 A1 | 11/2023 | Schumacher et al. | |
| 2023/0370062 A1 | 11/2023 | Wolf | |
| 2023/0378022 A1 | 11/2023 | Kim et al. | |
| 2023/0386963 A1 | 11/2023 | Kim et al. | |
| 2023/0402930 A1 | 12/2023 | Corry et al. | |
| 2023/0420968 A1 | 12/2023 | Oner et al. | |
| 2023/0421049 A1 | 12/2023 | Neidorff | |
| 2024/0006869 A1 | 1/2024 | Kim et al. | |
| 2024/0006899 A1 | 1/2024 | Wernerus | |
| 2024/0006993 A1 | 1/2024 | Barjati et al. | |
| 2024/0022187 A1 | 1/2024 | Fassnacht | |
| 2024/0022240 A1 | 1/2024 | Balaz | |
| 2024/0022244 A1 | 1/2024 | S et al. | |
| 2024/0030730 A1 | 1/2024 | Wernerus | |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0105276 A1 | 3/2024 | Duryea | |
| 2024/0106248 A1 | 3/2024 | Woll et al. | |
| 2024/0106435 A1 | 3/2024 | Zhang et al. | |
| 2024/0113517 A1 | 4/2024 | Sriraj et al. | |
| 2024/0113611 A1 | 4/2024 | Kaufmann et al. | |

(56) References Cited

U.S. PATENT DOCUMENTS

| | | |
|---|---|---|
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2018158726 A1 | 9/2018 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Xu Fan et al: "Suppressing Gate Voltage Oscillation in Paralleled SiC MOSFETs for HEV/EV Traction Inverter Application", 2019 IEEE Energy Conversion Congress and Exposition (ECCE), IEEE, Sep. 29, 2019 (Sep. 29, 2019), pp. 3548-3553.

* cited by examiner

SYSTEMS AND METHODS FOR MULTIPLE OUTPUT INTEGRATED GATE DRIVER FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a multiple output integrated gate driver for an inverter for an electric vehicle, and, more particularly, to systems and methods for a multiple output integrated gate driver for a power device switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, multiple power device switches in a power module may share different currents during switching of the power device switches.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power module including: a drain tab; a source tab; a first power switch including a first gate terminal configured to control a first flow of current between the drain tab and the source tab; a second power switch including a second gate terminal configured to control a second flow of current between the drain tab and the source tab; and one or more controllers configured to provide a first signal to the first gate terminal and a second signal to the second gate terminal.

In some aspects, the techniques described herein relate to a system, wherein the one or more controllers includes one or more point-of-use controllers on the power module with the first power switch and the second power switch.

In some aspects, the techniques described herein relate to a system, wherein the drain tab is configured to be connected to a positive terminal of the battery, and the source tab is configured to be connected to a phase terminal of the motor.

In some aspects, the techniques described herein relate to a system, wherein the source tab is configured to be connected to a negative terminal of the battery, and the drain tab is configured to be connected to a phase terminal of the motor.

In some aspects, the techniques described herein relate to a system, wherein the power module further includes: a command pin, wherein the one or more controllers is further configured to receive a gate command via the command pin, and provide the first signal to the first gate terminal and the second signal to the second gate terminal, based on the received gate command.

In some aspects, the techniques described herein relate to a system, wherein the one or more controllers is further configured to delay providing the first signal to the first gate terminal, relative to providing the second signal to the second gate terminal.

In some aspects, the techniques described herein relate to a system, wherein the first power switch includes a first silicon carbide die, and the second power switch includes a second silicon carbide die.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter for an electric vehicle, the power module including: a drain tab; a source tab; a first power switch including a first gate terminal configured to control a flow of current between the drain tab and the source tab; a second power switch including a second gate terminal configured to control a flow of current between the drain tab and the source tab; and one or more controllers configured to provide a first signal to the first gate terminal and a second signal to the second gate terminal.

In some aspects, the techniques described herein relate to a system, wherein the first power switch includes a first group of silicon carbide dies, and the second power switch includes a second group of silicon carbide dies.

In some aspects, the techniques described herein relate to a system, wherein the first power switch has a first gate threshold voltage and the second power switch has a second gate threshold voltage different from the first gate threshold voltage.

In some aspects, the techniques described herein relate to a system, wherein the first power switch has a first source inductance and the second power switch has a second source inductance different from the first source inductance.

In some aspects, the techniques described herein relate to a system, wherein the one or more controllers is configured to provide the first signal to the first gate terminal independently from providing the second signal to the second gate terminal.

In some aspects, the techniques described herein relate to a system, the power module further including: a command pin, wherein the one or more controllers is further configured to receive a gate command via the command pin, and provide the first signal to the first gate terminal and the second signal to the second gate terminal, based on the received gate command.

In some aspects, the techniques described herein relate to a system including: one or more point-of-use controllers for a power module for an inverter, the one or more point-of-use controllers configured to: receive a gate command; generate a first signal for a first gate terminal of a first power switch, based on the received gate command; and generate a second signal for a second gate terminal of a second power switch, based on the received gate command.

In some aspects, the techniques described herein relate to a system, wherein the one or more point-of-use controllers is further configured to generate the first signal based on a first source inductance of the first power switch, and generate the second signal based on a second source inductance of the second power switch.

In some aspects, the techniques described herein relate to a system, wherein the one or more point-of-use controllers is further configured to: receive a first sensing signal from the first power switch; generate the first signal based on the first sensing signal; receive a second sensing signal from the second power switch; and generate the second signal based on the second sensing signal.

In some aspects, the techniques described herein relate to a system, wherein the one or more point-of-use controllers is further configured to: control a first current through the first power switch using the first signal; and control a second current through the second power switch using the second signal.

In some aspects, the techniques described herein relate to a system, wherein the one or more point-of-use controllers is further configured to: control the first current through the first power switch to be approximately equal to the second current through the second power switch during one or more of a turn-on or a turn-off event of the first power switch and the second power switch.

In some aspects, the techniques described herein relate to a system, wherein the one or more point-of-use controllers is further configured to generate the first signal based on one or more of variation in intrinsic parameters of the first power switch, parameter drift over a life of the first power switch, or an operating temperature of the first power switch.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
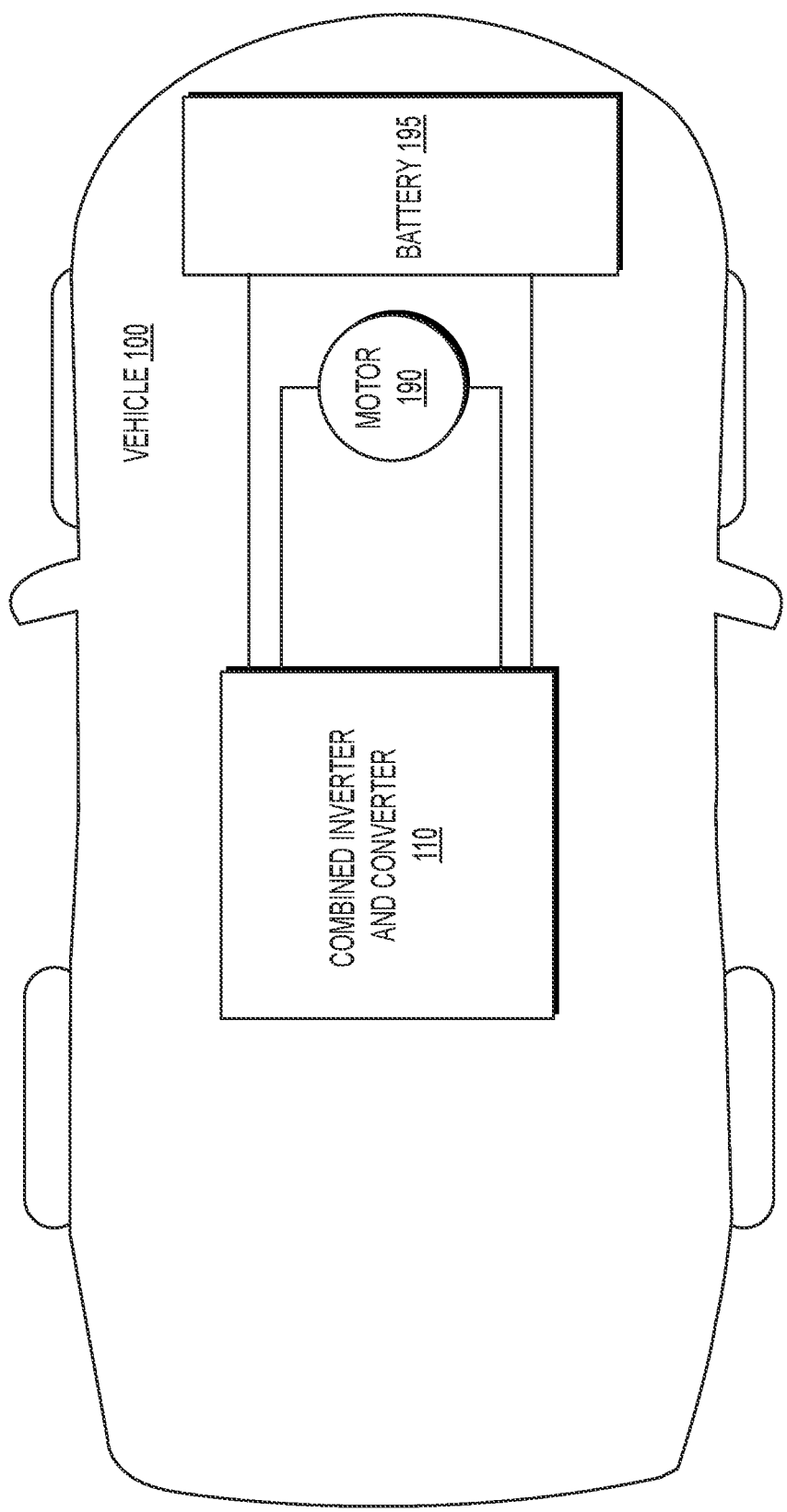
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a multiple output integrated gate driver for an inverter for an electric vehicle, and, more particularly, to systems and methods for a multiple output integrated gate driver for a power device switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

Some power modules may have one gate drive pin per switch, so a single output gate driver that is remote to a power module may have a single gate drive output to drive the power module with a single gate drive pin. High current and/or high power silicon carbide (SiC) power modules have multiple SiC dies in parallel to share the high current throughput. However, due to layout constraints, for example, the SiC dies may be presented with different source inductances, which may cause unequal current sharing between the dies at turn on and turn-off switching events. The single gate connection may maintain a voltage potential at a constant value, while the source voltage of a SiC die with a higher source inductance rises, which may pinch off the gate-to-source voltage of the SiC die. The different transient current sharing may apply different stresses to the SiC dies, which may lead to a failure of the SiC devices.

One or more embodiments may provide an integrated gate driver with multiple gate drive outputs. The integrated gate driver may provide multiple gate drive outputs without adding additional pins to the power module. The integrated gate driver may eliminate external pins for the gates of the power FETs. Eliminating gate pins may lower costs for the assembly, may provide appreciably lower gate stray inductance, and may lower electromagnetic radiation and provide lower susceptibility to external electromagnetic interference. These factors may allow the integrated gate driver to drive the gate terminals in such a manner to reduce the turn on/off energy losses. The integrated gate driver may be co-located with and provided on the power module with the SiC dies. The integrated gate driver may be an application-specific integrated circuit (ASIC). The integrated gate driver may provide faster and more reliable sensing, control, and protection of SiC power FETs. One or more embodiments may provide a multiple output integrated gate driver with a first gate drive output that is targeted to a first group of one or more SiC dies, and a second gate drive output that is targeted to a second group of one or more SiC dies. The first group of one or more SiC dies may have a first source inductance, and the second group of one or more SiC dies may have a second source inductance that is higher than the first source inductance. The one or more SiC dies may be grouped according to voltage threshold, transconductance, or Rdson, for example. The values of the grouping parameters may be determined during end-of-line testing. The integrated gate driver may include gate drive outputs that are current digital-to-analog converters so that the current flowing into each SiC gate of the first group and the second group provides a comparable turn-on and turn-off switching performance to allow reduced switching energy losses of the power FETs.

One or more embodiments may allow the two groups of SiC dies to turn on much more equally, because the gate-to-source voltages change as a function of the charge added to the gate. The gates of the two groups of SiC dies may be allowed to move independently, such as +/−30 nanoseconds, for example, with the source of the respective group, which may prevent the gate-to-source voltages of the higher inductance group from getting pinched off. One or more embodiments may provide much better turn-on and turn-off current distributions between groups of SiC devices, relative to a single output gate driver with only one gate drive output. Better turn-on and turn-off current distributions may allow the transient current stresses to be distributed much more uniformly among the SiC dies, which may improve the long term reliability of the SiC devices.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
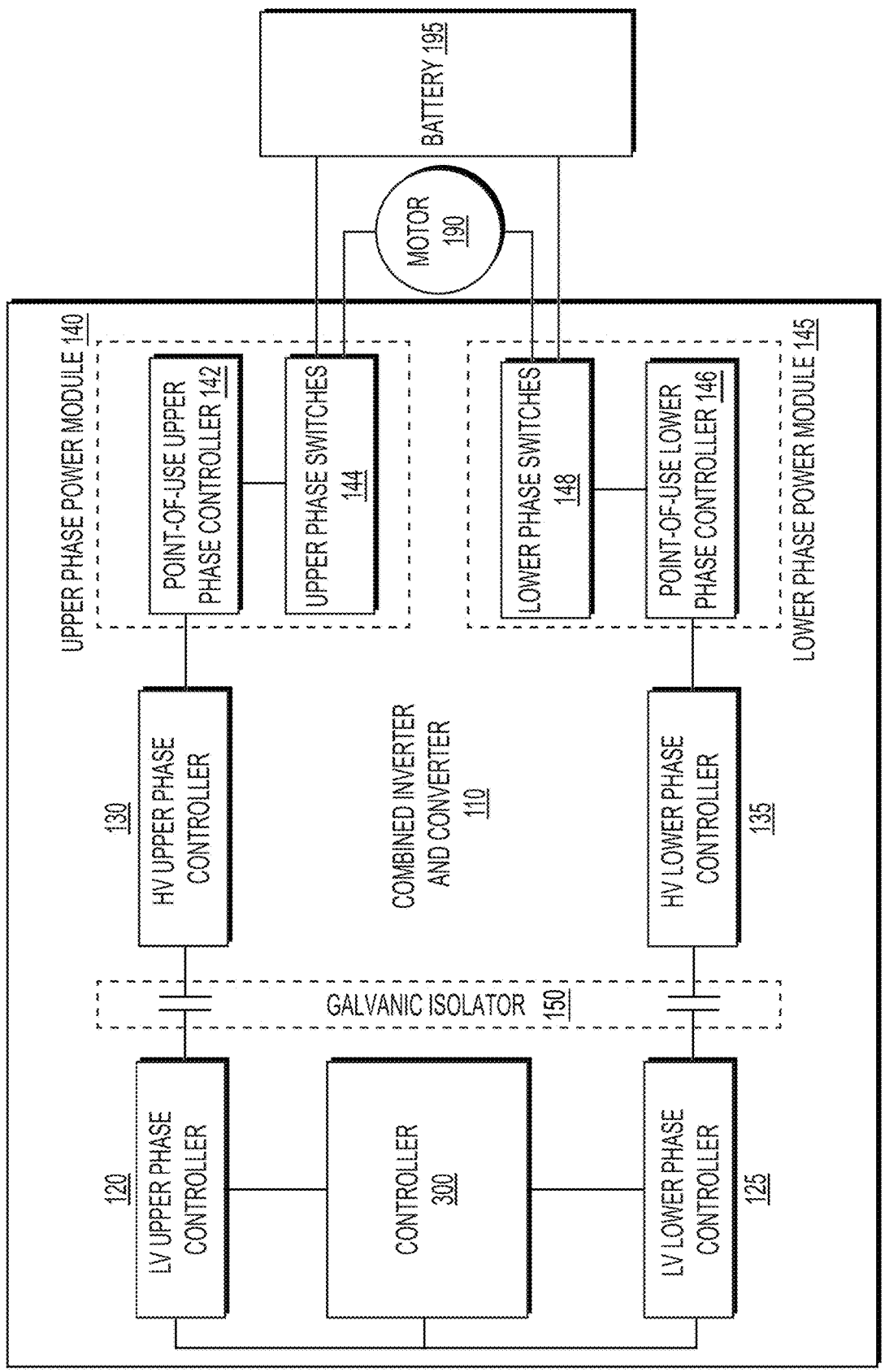
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
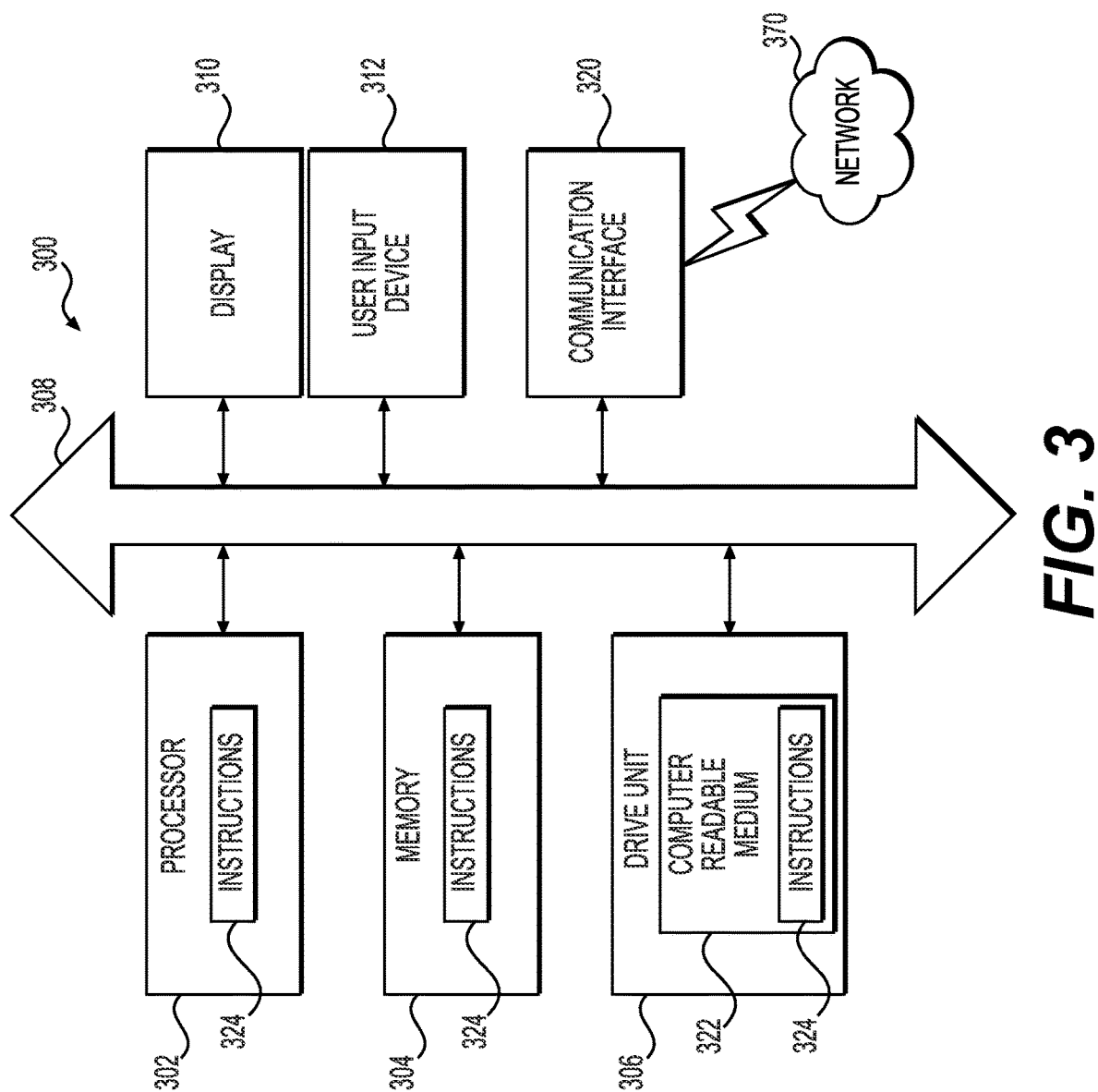
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
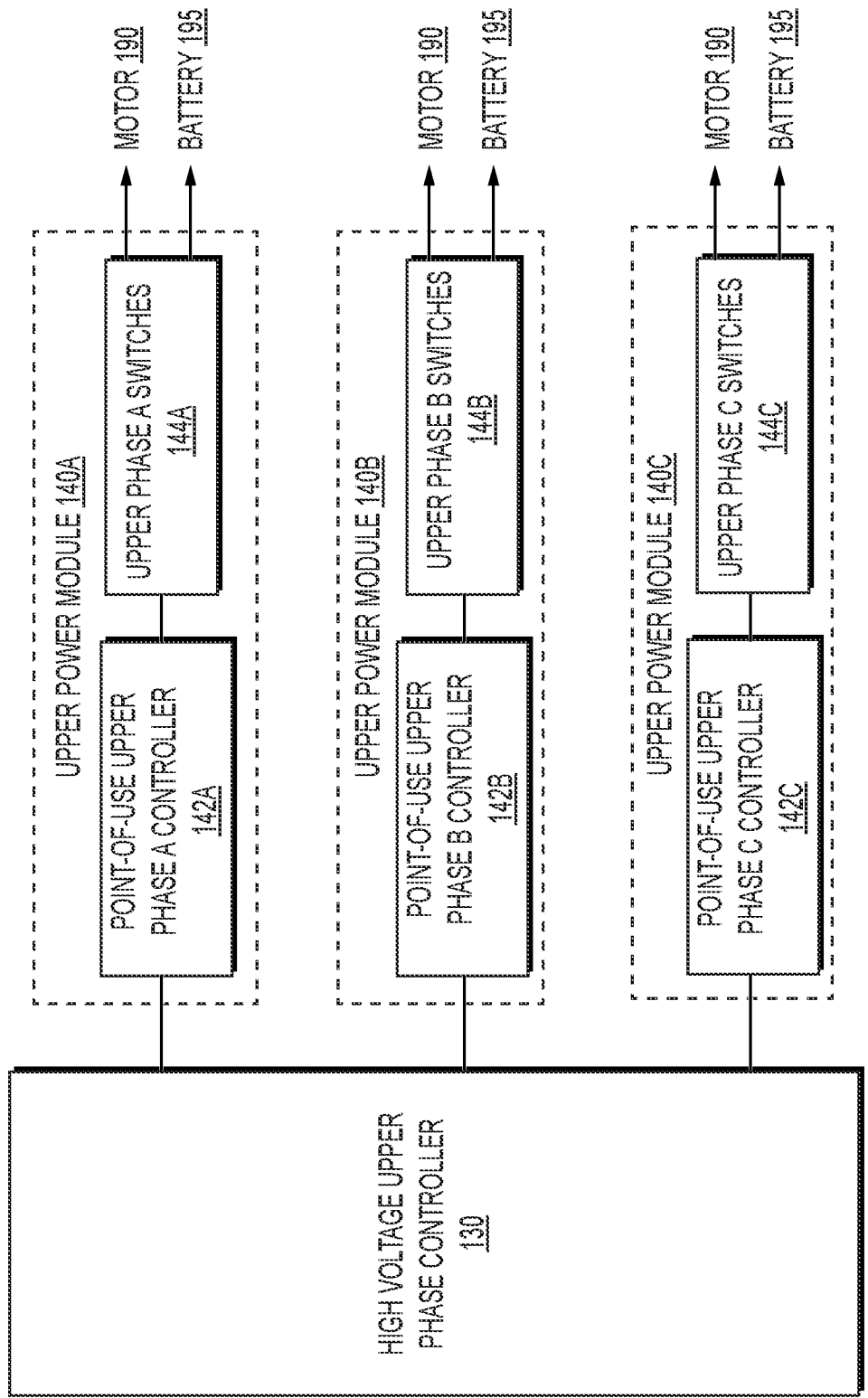
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
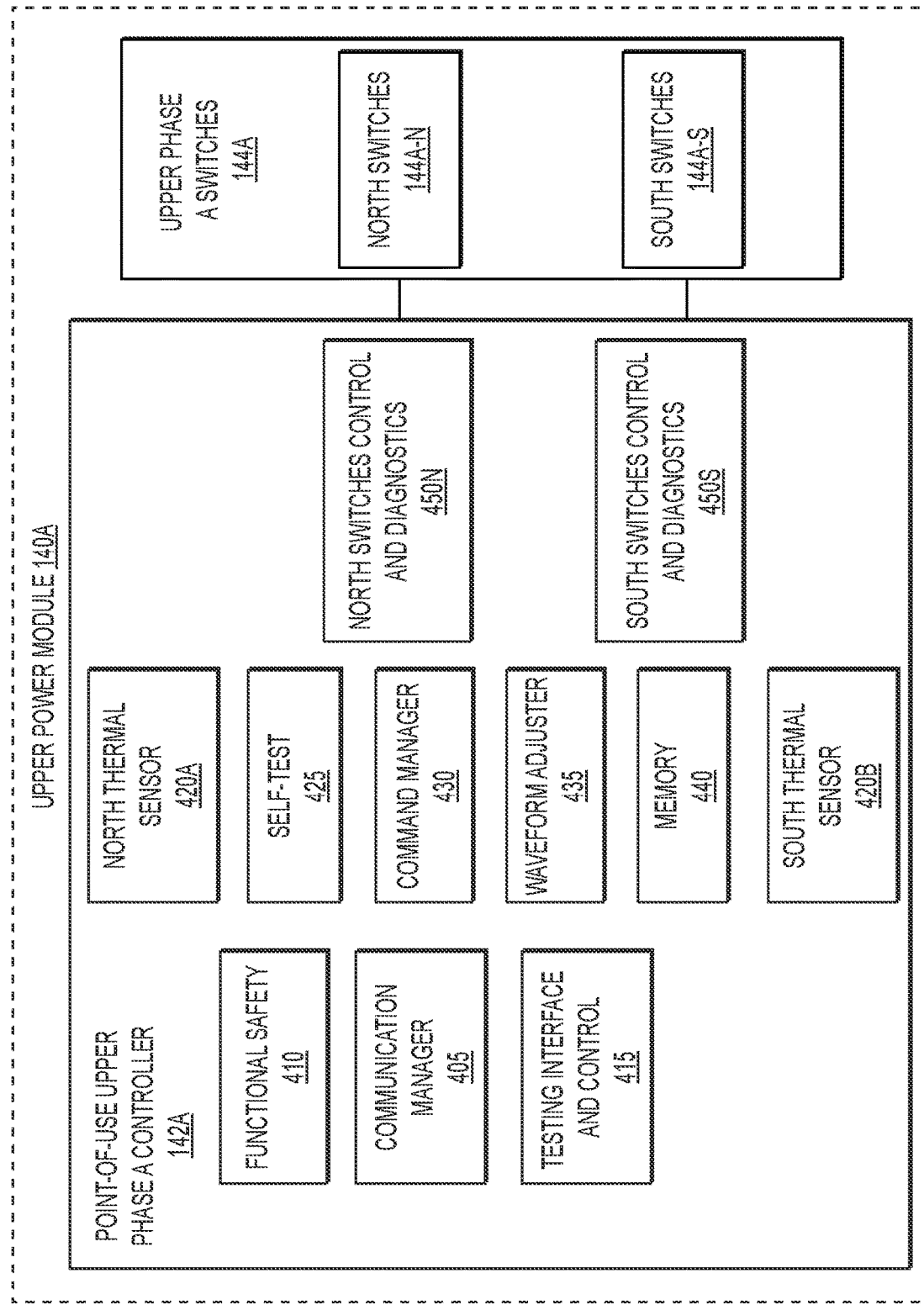
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
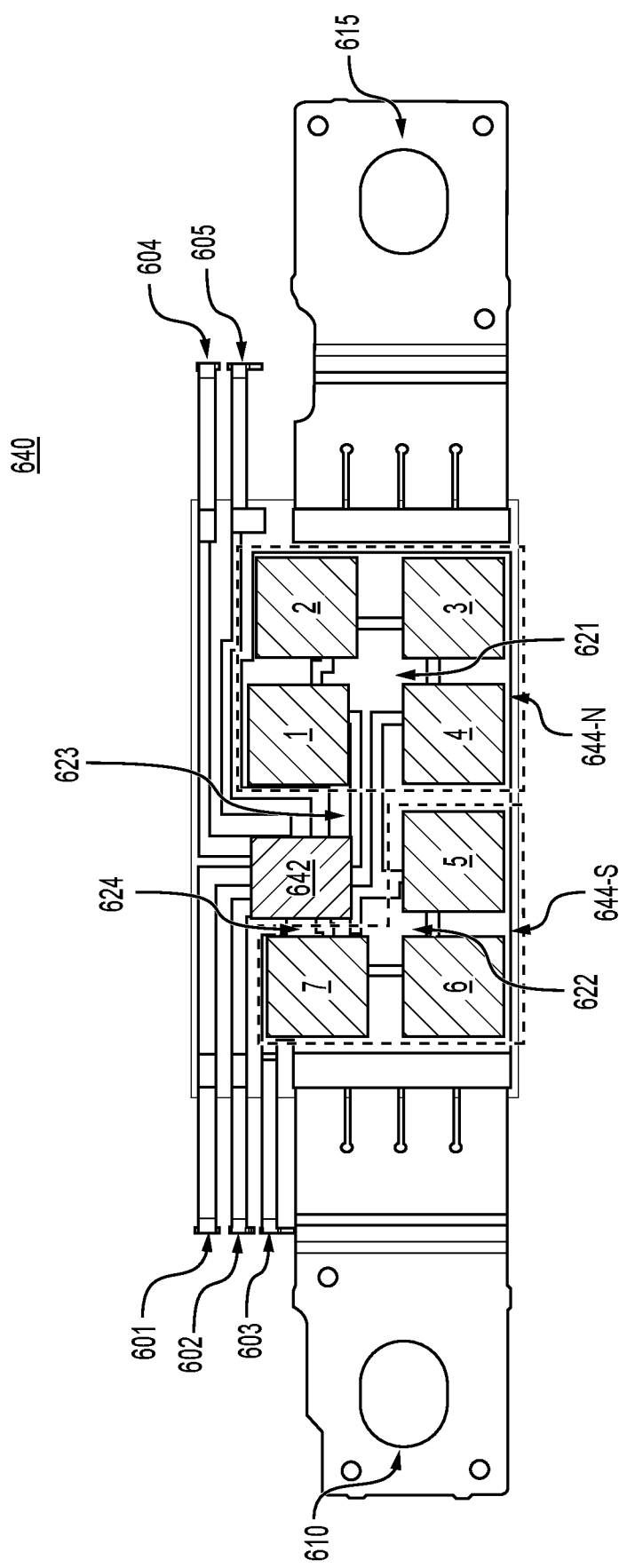
FIG. 6 depicts an exemplary system for a power module including a multiple output integrated gate driver, according to one or more embodiments.

FIG. 6 depicts an exemplary system for a power module including a multiple output integrated gate driver, according to one or more embodiments. As shown in FIG. 6, power module 640 may include point-of-use phase controller 642, north phase switches 644-N, and south phase switches 644-S. Power module 640 may be an implementation of upper phase power module 140A, for example. Point-of-use phase controller 642 may be an implementation of point-of-use upper phase A controller 142A, north phase switches 644-N may be an implementation of north switches 144A-N, and south phase switches 644-S may be an implementation of south switches 144A-S.

As shown in FIG. 6, north phase switches 644-N may include SiC dies 1-4, and south phase switches 644-S may include SiC dies 5-7. However, the disclosure is not limited thereto, and SiC dies 1-7 may be grouped into any suitable configuration. Power module 640 may include more or less than 7 SiC dies. As shown in FIG. 6, point-of-use phase controller 642 may control two groups of SiC dies, namely north phase switches 644-N and south phase switches 644-S. However, SiC dies 1-7 may be grouped into more than two groups, and point-of-use phase controller 642 may control more than two groups. For example, SiC dies 1-7 may be grouped into three groups (e.g. 1-2, 3-5, and 6-7) and point-of-use phase controller 642 may independently control the three groups.

Power module 640 may include source tab 610, drain tab 615, positive voltage pin 601, common voltage pin 602, source pin 603, message pin 604, and command pin 605. Point-of-use phase controller 642 may communicate with high voltage upper phase controller 130, for example. Point-of-use phase controller 642 may receive operating power from positive voltage pin 601 and common voltage pin 602. Source pin 603 may be connected to source tab 610, and may be a Kelvin sense (source) terminal used to reduce the gate-drive sensitivity to di/dt of the source terminal. Point-of-use phase controller 642 may receive commands from command pin 605, and may send and receive messages on message pin 604. However, the disclosure is not limited thereto, and pins 601-605 may be used in any configuration suitable for an application.

Point-of-use phase controller 642 may receive a gate turn-on command via command pin 605, for example. Based on the gate turn-on command, point-of-use phase controller 642 may turn on gates of north phase switches 644-N using north gate trace 621, and may turn on gates of south phase switches 644-S using south gate trace 622. This, in turn, may turn on north phase switches 644-N and south phase switches 644-S such that current flows between source tab 610 and drain tab 615. The point-of-use phase controller 642 may monitor north phase switches 644-N and south phase switches 644-S using north sense trace 623 to south sense trace 624.

Point-of-use phase controller 642 may be a multiple output integrated gate driver, integrated into power module 640 with north phase switches 644-N and south phase switches 644-S, with multiple gate drive outputs to independently drive north phase switches 644-N and south phase switches 644-S. Point-of-use phase controller 642 may provide multiple gate drive outputs without adding additional pins to power module 640. Point-of-use phase controller 642 may be provided on power module 640 with the north phase switches 644-N and south phase switches 644-S (including SiC dies 1-7). Point-of-use phase controller 642 may be an application-specific integrated circuit (ASIC). Point-of-use phase controller 642 may include a first gate drive output, north gate trace 621, that is targeted to north phase switches 644-N (e.g. SiC dies 1-4), and a second gate drive output, south gate trace 622, that is targeted to south phase switches 644-S (e.g. SiC dies 5-7). North phase switches 644-N may have a first source inductance, and south phase switches 644-S may have a second source inductance that is lower than, or different from, the first source inductance. Point-of-use phase controller 642 may include gate drive outputs that are current output digital-to-analog converters so that the current flowing into each SiC gate of north phase switches 644-N and south phase switches 644-S is approximately equal.

Point-of-use phase controller 642 may allow north phase switches 644-N and south phase switches 644-S to turn on much more equally, because the gate-to-source voltages change as a function of the charge delivered to the gate. The gates of north phase switches 644-N and south phase switches 644-S may be allowed to move independently with the source of the respective group, which may prevent the gate-to-source voltages of the higher inductance group from getting pinched off. Point-of-use phase controller 642 may provide much better turn-on and turn-off current distributions between north phase switches 644-N and south phase switches 644-S, relative to a single output gate driver or a driver with only one gate drive output. Better turn-on and turn-off current distributions may allow the transient current stresses to be distributed much more uniformly among SiC dies 1-7, which may improve the long term reliability of the north phase switches 644-N and south phase switches 644-S, power module 640, inverter 110, and electric vehicle 100.

Figure 7:
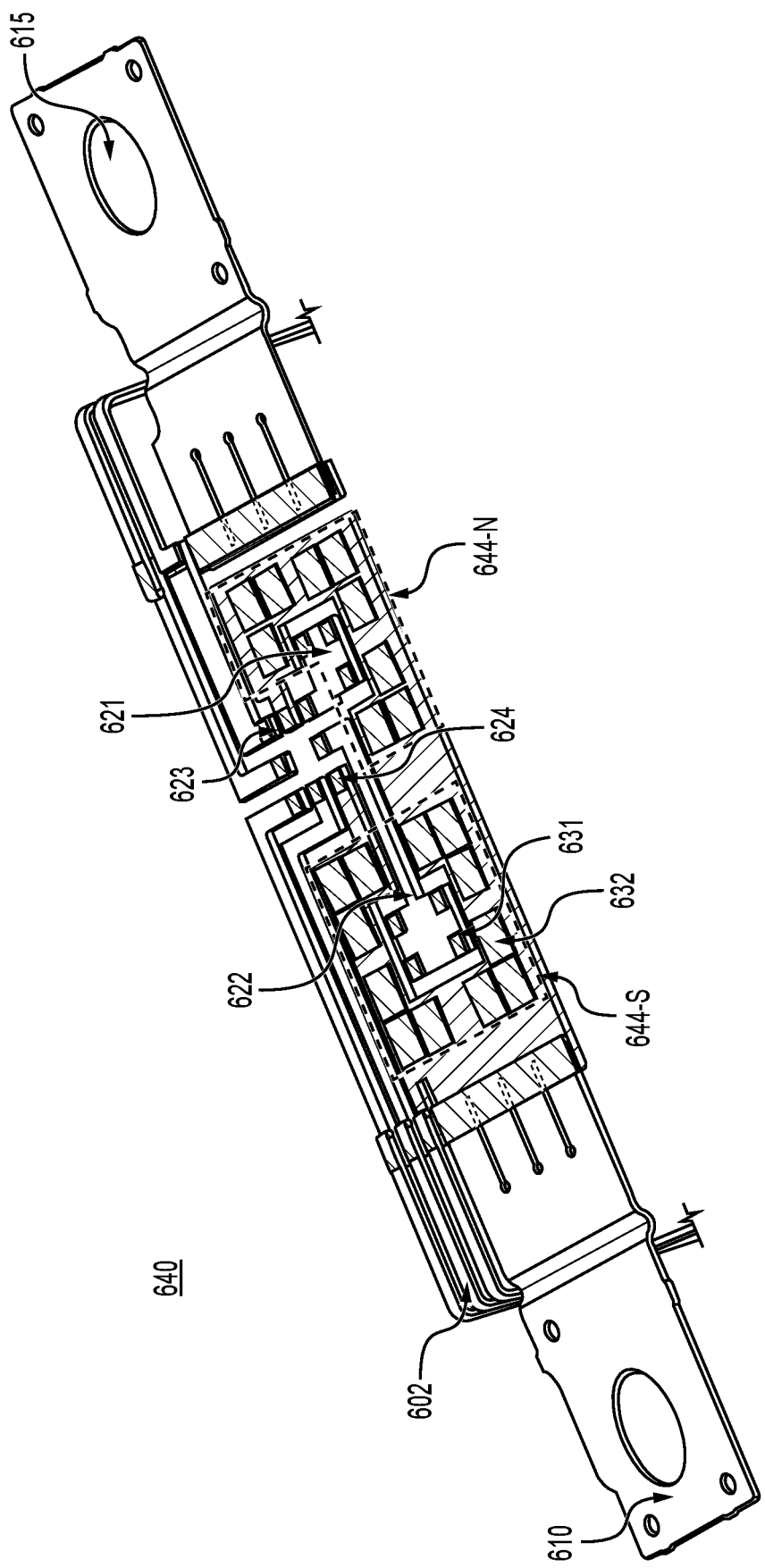
FIG. 7 depicts an exemplary connection layout for a power module including a multiple output integrated gate driver, according to one or more embodiments.

FIG. 7 depicts an exemplary connection layout for a power module including a multiple output integrated gate driver, according to one or more embodiments. FIG. 7 shows the connections for power module 640 as illustrated in FIG. 6, for example. As shown in FIG. 7, point-of-use phase controller 642 may have eight connection points.

Command pin 605 may be one of four pins (positive voltage pin 601, common voltage pin 602, message pin 604, and command pin 605) that are connected to point-of-use phase controller 642. As shown in FIGS. 6 and 7, source pin 603 may be connected to source tab 610. FIG. 7 depicts north sense trace 623 and south sense trace 624 as two connections to point-of-use phase controller 642. North gate trace 621 and south gate trace 622 may be two connections to point-of-use phase controller 642, and may connect point-of-use phase controller 642 to north phase switches 644-N and south phase switches 644-S, respectively.

FIG. 7 further depicts gate connection 631 and die connection 632, for example, for south phase switches 644-S. Gate connection 631 may provide a path from south gate trace 622 to a gate of south phase switches 644-S, and die connection 632 may provide a path through a die of south phase switches 644-S for current flow between source tab 610 and drain tab 615. Other SiC dies for south phase switches 644-S and north phase switches 644-N may have a similar structure, and therefore, gate connection 631 and die connection 632 are not labelled for every SiC die in power module 640.

Figure 8:
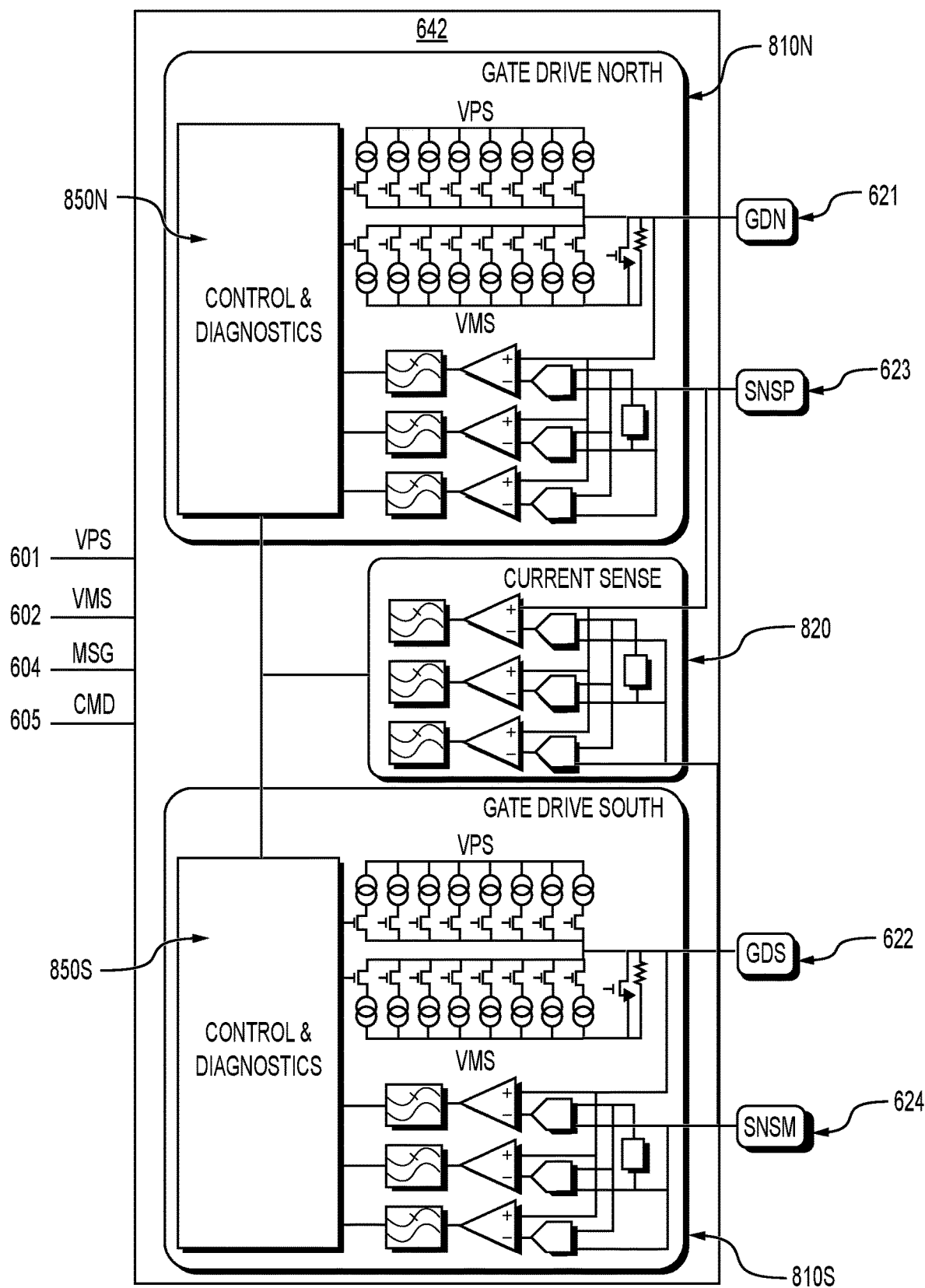
FIG. 8 depicts an exemplary block diagram for a multiple output integrated gate driver, according to one or more embodiments.

FIG. 8 depicts an exemplary block diagram for a multiple output integrated gate driver, according to one or more embodiments. As shown in FIG. 8, point-of-use phase controller 642 may include connection points for positive voltage pin 601, common voltage pin 602, message pin 604, and command pin 605. Point-of-use phase controller 642 may include connection points for north gate trace 621, south gate trace 622, north sense trace 623, and south sense trace 624.

Point-of-use phase controller 642 may include north gate driver 810N, south gate driver 810S, and current sensor 820. Point-of-use phase controller 642 may sense a gate-to-source voltage of the north phase switches 644-N relative to north sense trace 623, and sense a gate-to-source voltage of the south phase switches 644-S relative to south sense trace 624. This gate-to-source voltage sensing may be a use of north sense trace 623 and south sense trace 624 that is in addition to a use for current sensing. North gate driver 810N may include north switches control and diagnostics controller 850N, which may be an implementation of north switches control and diagnostics controller 450N, for example. South gate driver 810S may include south switches control and diagnostics controller 850S, which may be an implementation of south switches control and diagnostics controller 450S, for example.

North gate driver 810N and south gate driver 810S may include circuitry as needed to monitor and control north phase switches 644-N and south phase switches 644-S. For example, north gate trace 621 may be driven, based on command pin 605, with varying source gate current drivers and varying sink gate current drivers. The source gate current drivers may have amplitude time-varying values for the turn-on period, and the sink gate current drivers may have amplitude time-varying values for the turn-off period of north phase switches 644-N, respectively. The source gate current drivers and sink gate current drivers may be dynamically selected by operation of respective switches based on the respective turn-on and turn-off control signals from north switches control and diagnostics controller 850N. The source gate current drivers and sink gate current drivers may be selected using sense and control methods in order to drive the gate terminals of north phase switches 644-N to minimize switching losses based on one or more of variation in intrinsic parameters of north phase switches 644-N, parameter drift over the life of north phase switches 644-N, or operating temperature of north phase switches 644-N.

As shown in FIG. 8, both north phase switches 644-N and south phase switches 644-S may have an independent gate driver system. South gate driver 810S may operate in a similar manner as north gate driver 810N.

North phase switches 644-N and south phase switches 644-S, for example, may include multiple devices (i.e. multiple SiC dies) in parallel to deliver a maximum requested power transfer to a load. Due to the device parameter mismatches from the non-ideal manufacturing process of the SiC devices, the load current may not be equally shared among the parallel devices during both switching and conduction operations. However, point-of-use phase controller 642 may separately drive the gate terminal of each device or group of devices. This separate driving may offer the opportunity to schedule the turn-on and turn-off timings and calculated gate current profiles to minimize current imbalance in the parallel devices. For example, in the case when two devices are connected in parallel, if one device (or a group of parallel connected devices) has higher threshold voltage than a second device, the turn-on of the devices with a lower threshold voltage may be delayed with the respect to the turn-on time of the device with a higher threshold voltage, resulting in relatively equal current amplitude flowing in both devices. During the turn-off, the device with higher threshold voltage may be the device with delayed turn-off timing, contrary to the turn-on event delay. This separate driving may provide uniform and relatively equal temperature and relatively matched long-term longevity among the parallel devices.

In addition to introducing a turn-on/off delay between unmatched groups of devices, a unique gate-drive profile may be computed to further equalize and improve current sharing among groups of devices. Point-of-use phase controller 642 may minimize the current imbalance among the parallel-connected devices by prioritizing the turn-on and turn-off delay timings and computing appropriate gate-drive profiles among the devices.

Figure 9:
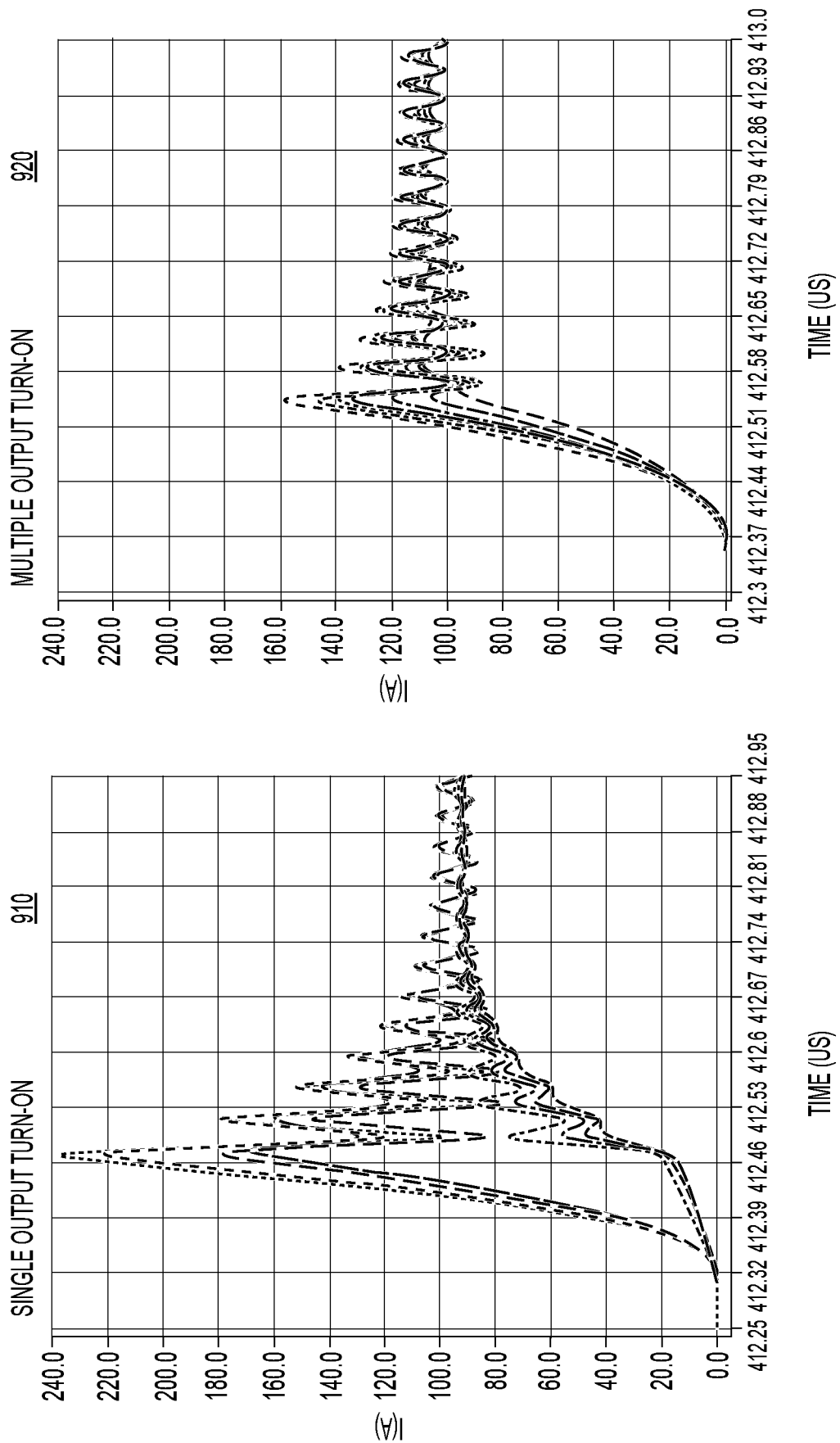
FIG. 9 depicts an exemplary turn-on plot for a system with a single output gate driver and an exemplary turn-on plot for a system with a multiple output integrated gate driver, according to one or more embodiments.

FIG. 9 depicts an exemplary turn-on plot for a system with a single output gate driver and an exemplary turn-on plot for a system with a multiple output integrated gate driver, according to one or more embodiments. FIG. 9 depicts a condition where with a single gate connection, even if the devices were matched with respect to threshold, the devices closest to the source tab have less inductance, and therefore reach higher peak currents, than those located farther away from the source tab. This may cause a mismatch in peak currents.

Single output gate driver turn-on plot 910 depicts the initial turn-on current for eight SiC dies. As shown in FIG. 9, for a single output gate driver, some SiC dies with lower threshold voltages may share an unequal load of the current, as illustrated by the four SiC dies with initial peak currents from approximately 160 A to approximately 240 A, relative to the four SiC dies with higher threshold voltages and initial peak currents from approximately 40 A to approximately 70 A as the devices reach the steady-state turn-on current of approximately 95 A. The four SiC dies with higher peak currents may experience higher transient current stresses, which may lead to a failure of the SiC devices.

Multiple output gate driver turn-on plot 920 depicts the initial turn-on current for seven SiC dies. However, as shown in FIG. 9, for a multiple output gate driver, and relative to the single output gate driver, all SiC dies may share a much more equal load of the current, as illustrated by the SiC dies with initial peak currents from approximately 90 A to approximately 160 as the devices reach the steady-state turn-on current of approximately 105 A.

Here, point-of-use phase controller 642, for example, may separately drive the gate terminal of each device or group of devices. This separate driving may offer the opportunity to schedule the turn-on timings and calculated gate current profiles to minimize current imbalance in the parallel devices. For example, in the case when two devices are connected in parallel, if one device (or a group of parallel connected devices) has higher threshold voltage than a second device, the turn-on of the device with a lower threshold voltage may be delayed with the respect to the turn-on time of the device with a higher threshold voltage, resulting in relatively equal current amplitude flowing in both devices. This separate driving may provide uniform and relatively equal temperature and relatively matched long-term longevity among the parallel devices.

Figure 10:
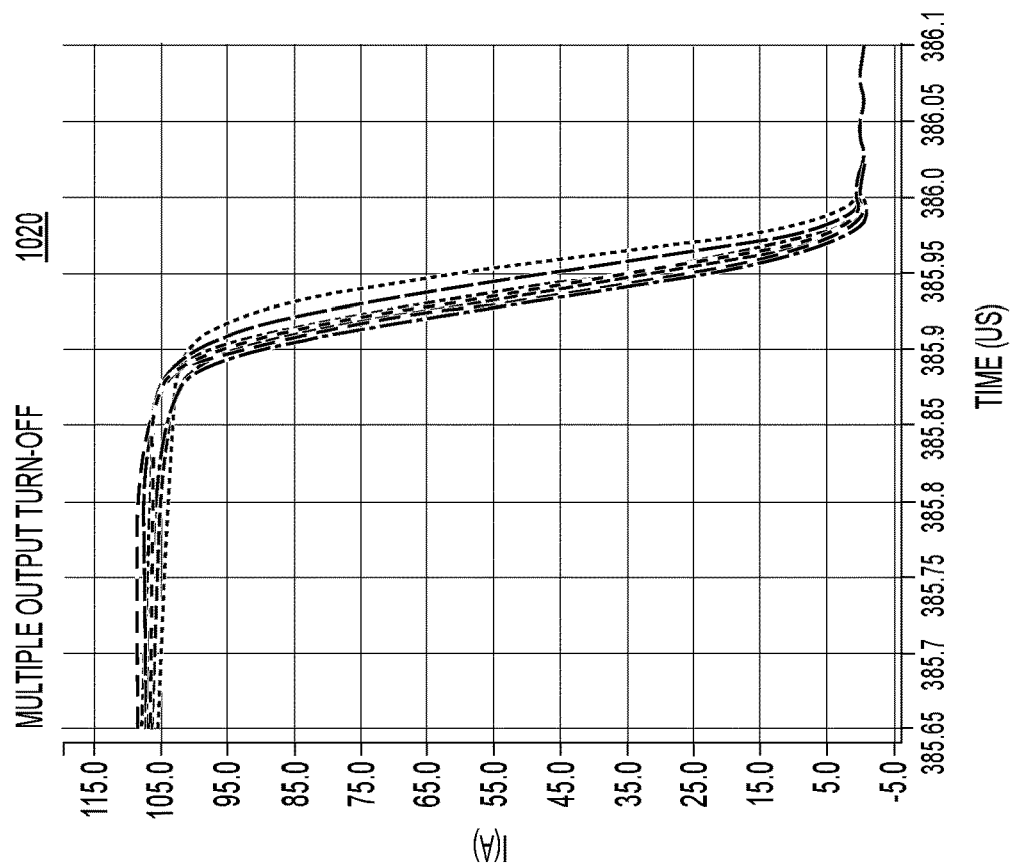
FIG. 10 depicts an exemplary turn-off plot for a system with a single output gate driver and an exemplary turn-off plot for a system with a multiple output integrated gate driver, according to one or more embodiments.
Figure 10:
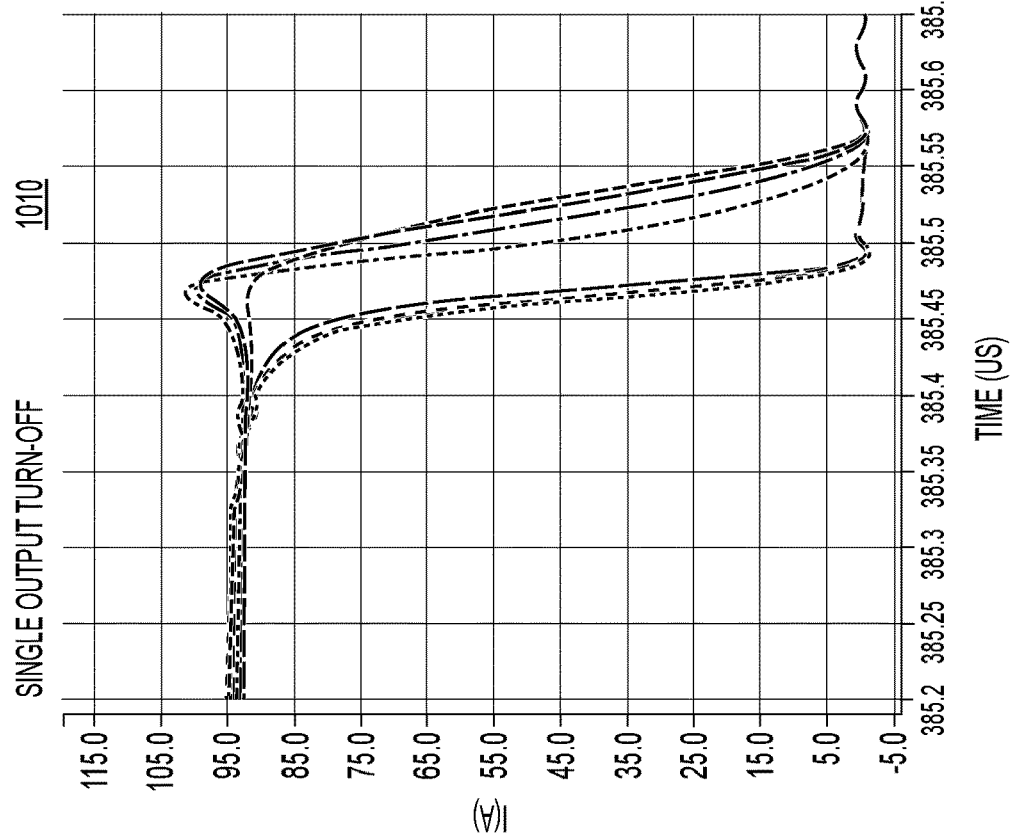

FIG. 10 depicts an exemplary turn-off plot for a system with a single output gate driver and an exemplary turn-off plot for a system with a multiple output integrated gate driver, according to one or more embodiments. FIG. 10 depicts devices with a matched threshold, with a difference being that the devices closer to the source have a lower parasitic source inductance than those further away. However, because all the gates are connected, the devices closest to the source turn off more quickly than the devices further away from the source.

Single output gate driver turn-off plot 1010 depicts the turn-off current for eight SiC dies. As shown in FIG. 10, for a single output gate driver, some SiC dies with lower threshold voltages may share an unequal load of the current, as illustrated by the three SiC dies with peak currents of approximately 100 A, relative to the five SiC dies with higher threshold voltages and peak currents near the steady-state turn-on current of approximately 95 A. The three SiC dies with higher peak currents may experience higher transient current stresses, which may lead to a failure of the SiC devices.

Multiple output gate driver turn-off plot 1020 depicts the turn-off current for seven SiC dies. However, as shown in FIG. 10, for a multiple output gate driver, and relative to the single output gate driver, all SiC dies may share a much more equal load of the current, as illustrated by the SiC dies with approximately equal currents from the steady-state turn-on current of approximately 105 A to the steady-state turn-off current of approximately 0 A.

Here, point-of-use phase controller 642, for example, may separately drive the gate terminal of each device or group of devices. This separate driving may offer the opportunity to schedule the turn-off timings and calculated gate current profiles to minimize current imbalance in the parallel devices. For example, in the case when two devices are connected in parallel, if one device (or a group of parallel connected devices) has higher threshold voltage than a second device, the turn-off of the device with a higher threshold voltage may be delayed with the respect to the turn-off time of the device with a lower threshold voltage, resulting in relatively equal current amplitude flowing in the devices. This separate driving may provide uniform and relatively equal temperature and relatively matched long-term longevity among the parallel devices.

One or more embodiments may provide an integrated gate driver with multiple gate drive outputs. The integrated gate driver may provide multiple gate drive outputs without adding additional pins to the power module. The integrated gate driver may be provided on the power module with the SiC dies. The integrated gate driver may be an application-specific integrated circuit (ASIC). One or more embodiments may provide a multiple output integrated gate driver with a first gate drive output that is targeted to a first group of one or more SiC dies, and a second gate drive output that is targeted to a second group of one or more SiC dies. The first group of one or more SiC dies may have a first source inductance, and the second group of one or more SiC dies may have a second source inductance that is higher than the first source inductance. The integrated gate driver may include gate drive outputs that are current output digital-to-analog converters so that the current flowing into each SiC gate of the first group and the second group is approximately equal.

One or more embodiments may allow the two groups of SiC dies to turn on much more equally, because the gate-to-source voltages change as a function of the charge added to the gate. The gates of the two groups of SiC dies may be allowed to move independently with the source of the respective group, which may prevent the gate-to-source voltages of the higher inductance group from getting pinched off. One or more embodiments may provide much better turn-on and turn-off current distributions between groups of SiC devices, relative to a single output gate driver with only one gate drive output. Better turn-on and turn-off current distributions may allow the transient current stresses to be distributed much more uniformly among the SiC dies, which may improve the long term reliability of the SiC devices.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
a power module including:
a drain tab;
a source tab;
a first power switch including a first gate terminal configured to control a first flow of current between the drain tab and the source tab;
a second power switch including a second gate terminal configured to control a second flow of current between the drain tab and the source tab; and
one or more controllers configured to provide a first signal to the first gate terminal and a second signal to the second gate terminal,
wherein the first power switch includes a first silicon carbide die, and the second power switch includes a second silicon carbide die.

2. The system of claim 1, wherein the one or more controllers includes one or more point-of-use controllers on the power module with the first power switch and the second power switch.

3. The system of claim 1, wherein the drain tab is configured to be connected to a positive terminal of the battery, and the source tab is configured to be connected to a phase terminal of the motor.

4. The system of claim 1, wherein the source tab is configured to be connected to a negative terminal of the battery, and the drain tab is configured to be connected to a phase terminal of the motor.

5. The system of claim 1, wherein the power module further comprises:
a command pin,
wherein the one or more controllers is further configured to receive a gate command via the command pin, and provide the first signal to the first gate terminal and the second signal to the second gate terminal, based on the received gate command.

6. The system of claim 1, further comprising:
the battery configured to supply the DC power to the inverter; and
the motor configured to receive the AC power from the inverter to drive the motor.

7. A system comprising:
an inverter configured to convert DC power from a battery to AC power to drive a motor, wherein the inverter includes:
a power module including:
a drain tab;
a source tab;
a first power switch including a first gate terminal configured to control a first flow of current between the drain tab and the source tab;
a second power switch including a second gate terminal configured to control a second flow of current between the drain tab and the source tab; and
one or more controllers configured to provide a first signal to the first gate terminal and a second signal to the second gate terminal
wherein the one or more controllers is further configured to delay providing the first signal to the first gate terminal, relative to providing the second signal to the second gate terminal.

8. A system including:
a power module for an inverter for an electric vehicle, the power module comprising:
a drain tab;
a source tab;
a first power switch including a first gate terminal configured to control a flow of current between the drain tab and the source tab;
a second power switch including a second gate terminal configured to control a flow of current between the drain tab and the source tab;
one or more controllers configured to provide a first signal to the first gate terminal and a second signal to the second gate terminal; and
a command pin,
wherein the one or more controllers is further configured to receive a gate command via the command pin, and provide the first signal to the first gate terminal and the second signal to the second gate terminal, based on the received gate command.

9. The system of claim 8, wherein the first power switch includes a first group of silicon carbide dies, and the second power switch includes a second group of silicon carbide dies.

10. The system of claim 8, wherein the first power switch has a first source inductance and the second power switch has a second source inductance different from the first source inductance.

11. The system of claim 8, wherein the one or more controllers is configured to provide the first signal to the first gate terminal independently from providing the second signal to the second gate terminal.

12. A system including:
a power module for an inverter for an electric vehicle, the power module comprising:
a drain tab;
a source tab;
a first power switch including a first gate terminal configured to control a flow of current between the drain tab and the source tab;
a second power switch including a second gate terminal configured to control a flow of current between the drain tab and the source tab; and
one or more controllers configured to provide a first signal to the first gate terminal and a second signal to the second gate terminal,
wherein the first power switch has a first gate threshold voltage and the second power switch has a second gate threshold voltage different from the first gate threshold voltage.

13. A system comprising:
one or more point-of-use controllers for a power module for an inverter, the one or more point-of-use controllers configured to:
receive a gate command;
generate a first signal for a first gate terminal of a first power switch, based on the received gate command; and
generate a second signal for a second gate terminal of a second power switch, based on the received gate command,
wherein the one or more point-of-use controllers is further configured to generate the first signal based on a first source inductance of the first power switch, and generate the second signal based on a second source inductance of the second power switch.

14. The system of claim 13, wherein the one or more point-of-use controllers is further configured to:
receive a first sensing signal from the first power switch;
generate the first signal based on the first sensing signal;
receive a second sensing signal from the second power switch; and
generate the second signal based on the second sensing signal.

15. The system of claim 13, wherein the one or more point-of-use controllers is further configured to:
control a first current through the first power switch using the first signal; and control a second current through the second power switch using the second signal.

16. The system of claim 15, wherein the one or more point-of-use controllers is further configured to generate the first signal based on one or more of variation in intrinsic parameters of the first power switch, parameter drift over a life of the first power switch, or an operating temperature of the first power switch.

17. A system comprising:
one or more point-of-use controllers for a power module for an inverter, the one or more point-of-use controllers configured to:
receive a gate command;
generate a first signal for a first gate terminal of a first power switch, based on the received gate command;
generate a second signal for a second gate terminal of a second power switch, based on the received gate command;
control a first current through the first power switch using the first signal; and control a second current through the second power switch using the second signal, wherein the one or more point-of-use controllers is further configured to:

control the first current through the first power switch to be approximately equal to the second current through the second power switch during one or more of a turn-on or a turn-off event of the first power switch and the second power switch.

* * * * *